United States Patent
Sriram et al.

(10) Patent No.: US 7,348,612 B2
(45) Date of Patent: Mar. 25, 2008

(54) METAL-SEMICONDUCTOR FIELD EFFECT TRANSISTORS (MESFETS) HAVING DRAINS COUPLED TO THE SUBSTRATE AND METHODS OF FABRICATING THE SAME

(75) Inventors: Saptharishi Sriram, Cary, NC (US); Scott Allen, Apex, NC (US)

(73) Assignee: Cree, Inc., Durham, NC (US)

( * ) Notice: Subject to any disclaimer, the term of this patent is extended or adjusted under 35 U.S.C. 154(b) by 107 days.

(21) Appl. No.: 10/977,054

(22) Filed: Oct. 29, 2004

(65) Prior Publication Data

US 2006/0091430 A1    May 4, 2006

(51) Int. Cl.
*H01L 31/112*    (2006.01)
(52) U.S. Cl. .............. 257/288; 257/E28.061; 438/286
(58) Field of Classification Search ........ 257/E29.061, 257/E29.321, 288, 578; 483/286
See application file for complete search history.

(56) References Cited

U.S. PATENT DOCUMENTS

| | | | |
|---|---|---|---|
| 3,903,592 A | 9/1975 | Heckl | |
| 3,969,745 A | 7/1976 | Blocker, III | |
| 3,986,196 A | 10/1976 | Decker et al. | |
| 4,732,871 A | 3/1988 | Buchmann et al. | |
| 4,737,469 A | 4/1988 | Stevens | |
| 4,757,028 A | 7/1988 | Kondoh et al. | |
| 4,762,806 A | 8/1988 | Suzuki et al. | |
| 4,803,526 A | 2/1989 | Terada et al. | |
| 4,897,710 A | 1/1990 | Suzuki et al. | |
| 4,947,218 A | 8/1990 | Edmond et al. | |
| 5,043,777 A * | 8/1991 | Sriram ........ | 257/194 |
| 5,138,407 A * | 8/1992 | Hirtz et al. ..... | 257/134 |
| 5,229,625 A | 7/1993 | Suzuki et al. | |
| 5,264,713 A | 11/1993 | Palmour | |
| 5,270,554 A | 12/1993 | Palmour | |
| 5,289,015 A | 2/1994 | Chirovsky et al. | |
| 5,300,795 A | 4/1994 | Saunier et al. | |
| 5,306,650 A | 4/1994 | O'Mara, Jr. et al. | |
| 5,396,085 A | 3/1995 | Baliga | |
| 5,399,883 A | 3/1995 | Baliga | |
| 5,510,630 A | 4/1996 | Agarwal et al. | |
| 5,686,737 A | 11/1997 | Allen | |

(Continued)

FOREIGN PATENT DOCUMENTS

DE    19900169    7/1999

(Continued)

OTHER PUBLICATIONS

*A 10 W 2 GHz Silicon Carbide MESFET*, Microwave Journal, Sep. 1999, pp. 232, 240, 242.

(Continued)

*Primary Examiner*—Thomas L. Dickey
(74) *Attorney, Agent, or Firm*—Myers Bigel Sibley & Sajovec

(57) ABSTRACT

The present invention provides a unit cell of a metal-semiconductor field-effect transistor (MESFET). The unit cell of the MESFET includes a MESFET having a source region, a drain region and a gate contact. The gate contact is disposed between the source region and the drain region. The drain region is electrically coupled to the substrate through a contact via hole to the substrate. Related methods of fabricating MESFETs are also provided herein.

66 Claims, 9 Drawing Sheets

U.S. PATENT DOCUMENTS

| | | | |
|---|---|---|---|
| 5,719,409 | A | 2/1998 | Singh et al. |
| 5,742,082 | A * | 4/1998 | Tehrani et al. ............... 257/280 |
| 5,869,856 | A | 2/1999 | Kasahara |
| 5,891,769 | A | 4/1999 | Liaw et al. |
| 5,895,939 | A | 4/1999 | Ueno |
| 5,900,648 | A | 5/1999 | Harris et al. |
| 5,925,895 | A | 7/1999 | Sriram et al. |
| 5,972,801 | A | 10/1999 | Lipkin et al. |
| 6,107,649 | A | 8/2000 | Zhao |
| 6,121,633 | A | 9/2000 | Singh et al. |
| 6,218,680 | B1 | 4/2001 | Carter, Jr. et al. |
| 6,316,793 | B1 | 11/2001 | Sheppard et al. |
| 6,476,431 | B1 * | 11/2002 | Ohno et al. .................. 257/280 |
| 6,686,616 | B1 | 2/2004 | Allen et al. |
| 2002/0043697 | A1 * | 4/2002 | Hirokawa et al. ........... 257/472 |
| 2002/0113240 | A1 * | 8/2002 | Ota ............................. 257/77 |
| 2003/0017660 | A1 | 1/2003 | Li |
| 2003/0075719 | A1 | 4/2003 | Sriram |
| 2004/0099888 | A1 * | 5/2004 | Sriram ........................ 257/288 |
| 2004/0226503 | A1 * | 11/2004 | Iwata et al. .................... 117/2 |

FOREIGN PATENT DOCUMENTS

| | | |
|---|---|---|
| EP | 0 029 481 A1 | 6/1981 |
| EP | 0518 683 A1 | 12/1992 |
| JP | 47-5124 | 3/1972 |
| JP | 54-155482 | 10/1979 |
| JP | 59134874 | 8/1984 |
| JP | 60-142568 | 7/1985 |
| JP | 60-154674 | 8/1985 |
| JP | 60-189250 | 9/1985 |
| JP | 63-47983 | 2/1988 |
| JP | 64-59961 | 3/1989 |
| JP | 1-106476 | 4/1989 |
| JP | 1-106477 | 4/1989 |
| JP | 1-196873 | 8/1989 |
| JP | 1-308876 | 12/1989 |
| JP | 2-10772 | 1/1990 |
| JP | 4-4225534 | 8/1992 |
| JP | 9-36359 | 2/1997 |
| JP | 11-150124 | 6/1999 |
| JP | 2002280386 | 9/2002 |
| WO | WO 98/19342 | 5/1998 |
| WO | WO 01/67521 | 9/2001 |
| WO | WO 01/86727 | 11/2001 |

OTHER PUBLICATIONS

Allen, *Silicon Carbide MESFET's with 2W/mm and 50% P.A.E. at 1.8 GHz*, 1996.

Browne, Editorial: *The Power and the Glory*, Microwaves & RF, Jul. 1999, p. 17.

Browne, *SiC MESFET Delivers 10-W Power at 2GHZ*, Microwaves & RF, Oct. 1999, pp. 138-139.

Browne, *Top Products of 1999*, Microwaves &RF, Dec. 1999, pp. 223-233.

Carter et al., *Silicon Carbide and Related Materials, 1999, Part 2*, Materials Science Forum, vols. 338-342, pp. 1247-1266 (2000).

Evwaraye et al., "Examination of Electrical and Optical Properties of Vanadium in Bulk n-Type Silicon Carbide," J. Appl. Phys. vol. 76, No. 10, 1994.

*First Silicon Carbide Microwave Power Products Are Introduced*, Applied Microwave & Wireless, pp. 104.

Heftman, *Wireless Semi Technology Heads Into New Territory*, Microwaves & RF, Feb. 2000, pp. 31-38.

Hilton et al., *Suppression of Instabilities in 4H-SiC Microwave MESFETs*, 2000 8$^{th}$ IEEE International Symposium.

Hilton et al., *Surface Induced Instabilities in 4H-SiC Microwave MESFETs*, Materials Science Forum, vols. 338-342, 2000, pp. 1251-1254.

Jonsson et al., *Physical Simulations on the Operations of 4H-SiC Microwave Power Transistors*, Materials Science Forum, vols. 338-342, 2000, pp. 1263-1266.

Kelner et al., *β-SiC MESFET's and Buried-Gate JFET's*, IEEE Electron Device Letters, vol. EDL-8, No. 9, Sep. 1987, pp. 428-430.

Kong et al., *Temperature Dependence of the Current-Voltage Characteristics of Metal-Semiconductor Field-Effect Transistors in n-Type β -SiC Grown Via Chemical Vapor Deposition*, Appl. Phys. Lett., vol. 51, No. 6, Aug. 10, 1987, pp. 442-444.

Konstantinov et al., High Performance Silicon Carbide MESFET Utilizing Lateral Epitaxy, *Materials Science Forum*, vols. 389-393, pp. 1375-1378.

Konstantinov et al., *Investigation of Lo-Hi-Lo and Delta-Doped Silicon Carbide Structures*, Mat. Res. Soc. Symp. Proc., vol. 640, 2001, pp. H2.4.1-H2.4.6.

Ma, et al., *High Efficiency LDMOS Power FET for Low Voltage Wireless Communications*, 1996 IEEE.

Nilsson et al., *Characterization of SiC MESFETs on Conducting Substrates*, Materials Science Forum, vols. 338-342, 2000, pp. 1255-1258.

Noblanc et al., *Power Density Comparison Between Microwave Power MESFET's Processed on Conductive and Semi-Insulating Wafer*, Materials Science Forum, vols. 338-342, 2000, pp. 1247-1250.

Palmour et al., *Characterization of Device Parameters in High-Temperature Metal-Oxide-Semiconductor Field Effect Transistors in β -SiC Thin Films*, J. Appl. Phys, vol. 64, No. 4, Aug. 15, 1988, pp. 2168-2177.

Palmour et al., *High-Temperature Depletion-Mode Metal-Oxide-Semiconductor Field Effect Transistors in Beta-SiC Thin Films*, Appl. Phys. Lett., vol. 51, No. 24, Dec. 14, 1987, pp. 2028-2030.

Palmour et al., *Ultrafast Silicon-Carbide Rectifiers*, Powertechnics Magazine, Aug. 1989, pp. 18-21.

Rorsman et al., *Fabrication, Characterization and Modeling of SiC MESFET's*, Materials Science Forum, vols. 338-342, 2000, pp. 12-59-1262.

*SiC MESFET Drives PCS Base Stations*, Wireless Systems Design, Oct. 1999, pp. 24.

Soares, ed., *GaAs MESFET Circuit Design*, Artech House, 1988, pp. 7-9, 17-18.

Sze, *Physics of Semiconductor Devices, Second Edition*, John Wiley & Sons, 1981, pp. 341-347.

Yokogawa et al., *Electronic Properties of Nitrogen Delta-Doped Silicon Carbide Layers*, Mat. Res. Soc. Symp. Proc., vol. 640, 2001, pp. H2.5.1-H2.5.6.

International Search Report and Written Opinion of the International Searching Authority for International application No. PCT/US2005/030131, mailed May 24, 2006.

* cited by examiner

METAL-SEMICONDUCTOR FIELD EFFECT TRANSISTORS (MESFETS) HAVING DRAINS COUPLED TO THE SUBSTRATE AND METHODS OF FABRICATING THE SAME

FIELD OF THE INVENTION

The present invention relates to microelectronic devices and more particularly to transistors, for example, metal-semiconductor field-effect transistors (MESFETs).

BACKGROUND OF THE INVENTION

Electrical circuits requiring high power handling capability while operating at high frequencies such as radio frequencies, S-band and X-band have in recent years become more prevalent. Because of the increase in high power, high frequency circuits there has been a corresponding increase in demand for transistors that are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETs) were commonly used for high frequency applications but the power handling capability of previously known JFETs may also be limited.

Metal-semiconductor field effect transistors (MESFETs) have been developed for high frequency applications. The MESFET construction may be preferable for high frequency applications because only majority carriers carry current. The MESFET design may be preferred over MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affects the operating parameters. Of the characteristics that affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. In the past, semiconductor materials which have a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities may be preferred for high frequency applications because the higher velocity translates to shorter times from source to drain.

Electric breakdown field is the field strength at which breakdown of the Schottky junction and the current through the gate of the device suddenly increases. A high electric breakdown field material may be preferred for high power, high frequency transistors because larger electric fields generally can be supported by a given dimension of material. Larger electric fields allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

High frequency MESFETs may be manufactured of n-type III-V compounds, such as gallium arsenide (GaAs) because of their high electron mobilities. Although these devices provide increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-°K indicate that SiC would be suitable for high frequency, high power applications.

MESFETs having channel layers of silicon carbide have been produced on silicon the substrates (See, e.g., U.S. Pat. No. 4,762,806 to Suzuki et al. and U.S. Pat. No. 4,757,028 to Kondoh et al.). Because the semiconductor layers of a MESFET are epitaxial, the layer upon which each epitaxial layer is grown affects the characteristics of the device. Thus, a SiC epitaxial layer grown on a Si substrate generally has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate generally limits the ability of such devices to dissipate heat. Furthermore, the growth of SiC on Si generally results in defects in the epitaxial layers that result in high leakage current when the device is in operation.

Other MESFETs have been developed using SiC substrates. U.S. patent application Ser. No. 07/540,488 filed Jun. 19, 1990 and now abandoned, the disclosure of which is incorporated entirely herein by reference, describes a SiC MESFET having epitaxial layers of SiC grown on a SiC substrate. These devices exhibited improved thermal characteristics over previous devices because of the improved crystal quality of the epitaxial layers grown on SiC substrates. However, to obtain high power and high frequency it may be necessary to overcome the limitations of SiC's lower electron mobility.

Similarly, commonly assigned U.S. Pat. No. 5,270,554 to Palmour describes a SiC MESFET having source and drain contact formed on $n^+$ regions of SiC and an optional lightly doped epitaxial layer between the substrate and the n-type layer in which the channel is formed. U.S. Pat. No. 5,925,895 to Sriram et al. also describes a SiC MESFET and a structure that is described as overcoming "surface effects" which may reduce the performance of the MESFET for high frequency operation. Sriram et al. also describes SiC MESFETs that use $n^+$ source and drain contact regions as well as a p-type buffer layer. SiC MESFETs are also discussed in commonly assigned U.S. Pat. No. 6,686,616 to Allen et al.

Furthermore, conventional SiC FET structures may provide constant characteristics during the entire operating range of the FET, i.e. from fully open channel to near pinch-off voltage, by using a very thin, highly doped channel (a delta doped channel) offset from the gate by a lightly doped region of similar conductivity type. Delta doped channels are discussed in detail in an article by Yokogawa et al. entitled *Electronic Properties of Nitrogen Delta-Doped Silicon Carbide Layers*, MRS Fall Symposium, 2000 and an article by Konstantinov et al. entitled *Investigation of Lo-Hi-Lo and Delta Doped Silicon Carbide Structure*, MRS Fall Symposium, 2000. However, further improvements may be made in SiC MESFETs.

For example, as discussed above, SiC MESFETs may be desirable for use in applications that require RF power amplifiers with very high output power (~1 kW) in the UHF to S-band frequencies due to their high power density, high gain, high temperature operation and overall reliability. However, the periphery of the MESFET may be increased to achieve such a high power level, which may cause the device to exhibit instability due to odd mode oscillation. Conventional devices have been modified to address the issue of odd mode oscillation issue by coupling the gate and/or drain pads to one or more cells of the MESFET using resistors. However, this approach has proven relatively unsuccessful when a large number of MESFET cells are combined to achieve a very high power output. Accordingly, further improvements may be made with respect to existing SiC FET devices such that they may provide high power output with reduced odd mode oscillation.

SUMMARY OF THE INVENTION

Some embodiments of the present invention provide unit cell of a metal-semiconductor field-effect transistor (MESFET). The unit cells include a MESFET on a substrate. The MESFET has a source region, a drain region and a gate contact and the gate contact is between the source region and the drain region. The drain region is electrically coupled to the substrate through a contact via hole to the substrate.

In further embodiments of the present invention, the substrate may be an n-type substrate and the contact via hole may extend through the drain region and expose a first surface of the substrate. The substrate may be an n-type silicon carbide (SiC) substrate. First and second ohmic contacts may be provided on the source and drain regions that respectively define a source contact and a drain contact. A substrate contact may be provided on the exposed first surface of the substrate. A first overlayer may be provided in the contact via hole and may extend to the drain contact and the substrate contact. Thus, the first overlayer may electrically couple the drain contact to the substrate contact to electrically couple the drain region to the substrate.

In still further embodiments of the present invention, the substrate contact may be a non-ohmic contact. A third ohmic contact may be provided on a second surface of the substrate, opposite the first surface of the substrate, that defines a backside substrate contact. In certain embodiments of the present invention, the drain region may be electrically coupled to a drain pad and the contact via hole may be at least partially located in the drain pad.

In some embodiments of the present invention, the substrate contact may be an ohmic contact. A non-ohmic backside substrate contact may be provided on a second surface of the substrate, opposite the first surface of the substrate. A drain pad may be electrically coupled to the drain region and a wire may be provided to electrically couple the drain pad to the backside substrate contact.

In further embodiments of the present invention, the substrate may be a semi-insulating substrate or an n-type substrate and the contact via hole may extend through a first surface of the substrate to a second surface of the substrate, opposite the first surface of the substrate. In certain embodiments of the present invention, the substrate may be an n-type silicon carbide (SiC) substrate or a semi-insulating SiC substrate. First and second ohmic contacts may be provided on the source region and the drain region, respectively, that respectively define a source contact and a drain contact. A backside substrate contact may be provided on the second surface of the substrate and the contact via hole may expose a portion of the backside substrate contact. A first overlayer may be provided in the contact via hole and extend to the drain contact and the backside substrate contact. The first overlayer may electrically couple the drain contact to the backside substrate contact to electrically couple the drain region to the substrate. In certain embodiments of the present invention, the drain region may be electrically coupled to a drain pad and the contact via hole may be at least partially disposed in the drain pad.

In still further embodiments of the present invention, the substrate may have a thickness of from about 100 μm to about 400 μm. In certain embodiments of the present invention, the thickness of the substrate may be about 300 μm. An n-type conductivity channel layer may be provided on the substrate and the gate contact may be disposed on the n-type conductivity layer.

In some embodiments of the present invention, the n-type conductivity channel layer may include n-type conductivity silicon carbide (SiC) and the gate may extend into the n-type conductivity SiC channel layer. The gate contact may be disposed in a single recess or a double recess.

In further embodiments of the present invention, the contact via hole may be a first contact via hole. A p-type conductivity region may be provided beneath the source region and have an end that extends towards the drain region. The p-type conductivity region may be spaced apart from the n-type conductivity channel layer and be electrically coupled to the source region. A second contact via hole may be provided adjacent the source region that exposes the p-type conductivity region. An ohmic contact may be provided on the exposed portion of the p-type conductivity region.

In still further embodiments of the present invention, implanted n-type conductivity regions may be provided in the n-type conductivity channel layer that respectively define the source region and the drain region. The implanted n-type conductivity regions may have carrier concentrations greater than a carrier concentration of the n-type conductivity channel layer. The first and second ohmic contacts that respectively define a source contact and a drain contact may be disposed on the source region and the drain region, respectively.

In some embodiments of the present invention, a first buffer layer may be provided on the substrate and a second buffer layer may be on the first buffer layer. The n-type conductivity channel layer may be provided on the second buffer layer. The contact via hole may extend through the drain region, the n-type channel region and the first and second buffer layers to a first surface of the substrate. The contact via hole may further extend through the first surface of the substrate to a second surface of the substrate, opposite the first surface of the substrate.

In further embodiments of the present invention, the n-type conductivity channel layer may include a first n-type conductivity channel layer on the substrate and a second n-type conductivity channel layer on the first n-type conductivity channel layer. In certain embodiments of the present invention, the n-type conductivity channel layer may include first, second and third n-type conductivity SiC channel layers. The first, second and third n-type conductivity channel layers may have respective first, second and third carrier concentrations. The substrate may include n-type conductivity gallium arsenide (GaAs), semi-insulating GaAs, n-type conductivity gallium nitride (GaN) or semi-insulating GaN.

While the present invention is described above primarily with reference to MESFETs, other types of transistors as well as methods of fabricating transistors and, in particular, MESFETs are also provided.

DETAILED DESCRIPTION OF THE INVENTION

Figure 1:
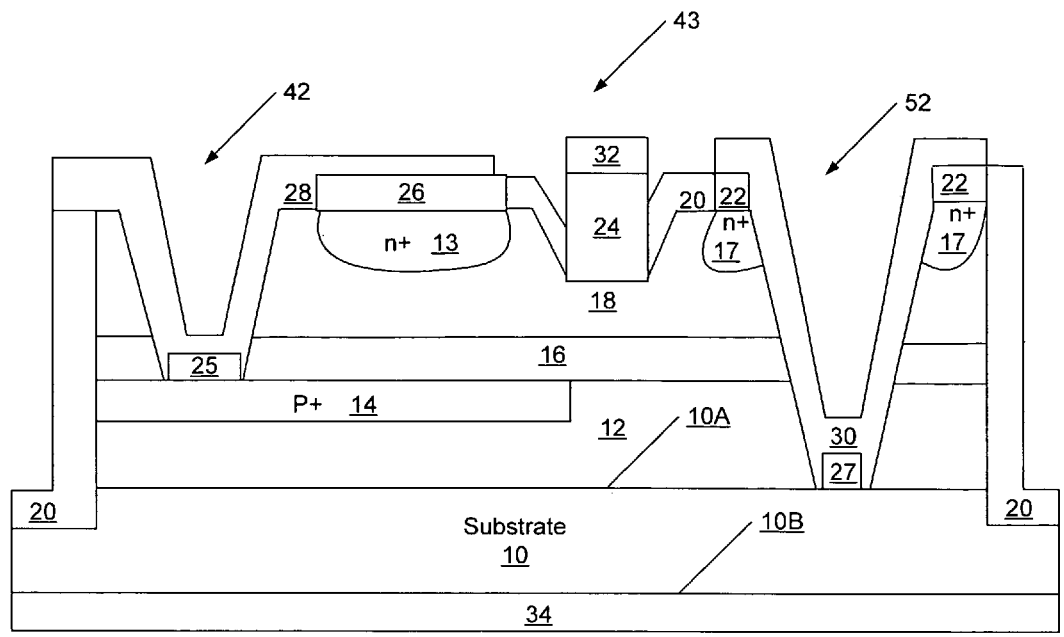
FIG. 1 is a cross-sectional view of metal-semiconductor field-effect transistors (MESFET) according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

Embodiments of the present invention will now be described in detail below with reference to FIGS. 1 through 7 that illustrate various embodiments of the present invention and various processes of fabricating embodiments of the present invention. As discussed herein, some embodiments of the present invention provide metal-semiconductor field effect transistors (MESFETs) having drain regions that are electrically coupled to a substrate through a contact via hole to the substrate. In certain embodiments of the present invention, the MESFET is provided on an n-type conductivity substrate and the contact via hole may extend to a first surface of the substrate. In these embodiments of the present invention, coupling the drain regions to the substrate may inhibit odd mode oscillation that may be present in conventional MESFET devices. Furthermore, these devices may be less expensive than conventional devices due the lower cost of n-type substrate materials. In further embodiments of the present invention, MESFETs may be provided on semi-insulating or n-type conductivity substrates and the contact via hole may extend through the first surface of the substrate to a second surface of the substrate. In these embodiments of the present invention, the coupling of the drain region to the substrate may reduce drain inductance and thereby reduce odd mode oscillation that may be present in conventional devices. Thus, embodiments of the present invention may provide MESFETs and methods of fabricating MESFETs having reduced odd mode oscillation as discussed further herein.

Some embodiments of the present invention will now be discussed with respect to cross-sections of MESFETs. The cross-sections discussed herein are taken along the line A-A' of the plan view of FIG. 6. Accordingly, cross-sections of embodiments of the present invention illustrated in the plan view of FIG. 7 are not provided herein.

Referring now to FIG. 1, metal-semiconductor field effect transistors (MESFETs) according to some embodiments of the present invention will be discussed. As illustrated in FIG. 1, a substrate 10 is provided. In particular, the substrate 10 in embodiments of the present invention illustrated in FIG. 1 may be a single crystal bulk silicon carbide (SiC) substrate of n-type conductivity. The substrate 10 of n-type conductivity may include 6H, 4H, 15R or 3C silicon carbide. In some embodiments of the present invention, the substrate 10 may have a thickness of from about 100 µm to about 400 µm, but may typically be about 300 µm. Although some embodiments of the present invention are discussed herein as having SiC substrates, embodiments of the present invention are not limited to this configuration. For example, in some embodiments, the substrate 10 may also include, for example, gallium arsenide (GaAs) and/or gallium nitride (GaN) without departing from the scope of the present invention.

A buffer layer 12 of, for example, p-type silicon carbide may be provided on the substrate 10. The buffer layer 12 may be formed of p-type conductivity silicon carbide of 6H, 4H, 15R or 3C polytype. The buffer layer 12 may, for example, have a carrier concentration of from about $0.5 \times 10^{15}$ cm$^{-3}$ to about $3.0 \times 10^{15}$ cm$^{-3}$. Suitable dopants include aluminum, boron and/or gallium. The buffer layer 12 may have a thickness of from about 5.0 to about 10.0 µm. Although the buffer layer 12 is described above as p-type silicon carbide, embodiments of the present invention should not be limited to this configuration. Alternatively, the buffer layer 12 may be undoped silicon carbide (i.e. not intentionally doped) or very low-doped n-type conductivity silicon carbide. If a very low doped n-type silicon carbide is utilized for the buffer layer 12, the carrier concentration of the buffer layer 12 may be less than about $5.0 \times 10^{14}$ cm$^{-3}$.

As further illustrated in FIG. 1, a p$^+$ region 14 is provided beneath a source of the device that has an end that extends towards the drain of the device. As used herein, "p$^+$" or "n$^+$" refer to regions that are defined by higher carrier concentrations than are present in adjacent or other regions of the same or another layer or substrate. Devices including and methods of fabricating p$^+$ regions as discussed herein are discussed in commonly assigned United States Patent Application Publication No. 2004/0099888, filed on Nov. 26, 2003, entitled Transistors Having Buried P-Type Layers Beneath The Source Region And Methods Of Fabricating The Same, the disclosure of which are hereby incorporated herein by reference as if set forth in its entirety.

The p$^+$ region 14 is a region of p-type conductivity, for example, p-type conductivity silicon carbide. For the p$^+$ region 14, carrier concentrations of from about $1.0 \times 10^{18}$ cm$^{-3}$ to about $1.0 \times 10^{20}$ cm$^{-3}$ may be suitable, but carrier concentrations as high as possible are preferred. The carrier concentration may not be constant throughout the p$^+$ region 14, but it is preferable that the carrier concentration be as high as possible at the surface of the p$^+$ region 14 to facilitate the formation of ohmic contacts thereon. In some embodiments of the present invention, the p$^+$ conductivity region 14 may be provided in the substrate 10 instead of the buffer layer 12.

It will be understood that although embodiments of the present invention are discussed herein as being included in a device having a p$^+$ region as discussed in United States Patent Application Publication No. 2004/0099888, filed on Nov. 26, 2003, entitled Transistors Having Buried P-Type Layers Beneath The Source Region And Methods Of Fabricating The Same, embodiments of the present invention are not limited to this configuration. For example, embodiments of the present invention may be included in MESFET devices having, for example, a p$^+$ region that extends under both the source and the drain without departing from the scope of the present invention.

The buffer layer 12 may be disposed between the substrate 10 and a second buffer layer 16. In some embodiments of the present invention, the buffer layer 12, may be optional. The second buffer layer 16 may be, for example, p-type silicon carbide having a carrier concentration of about $5 \times 10^{15}$ cm$^{-3}$. The second buffer layer 16 may also have a thickness of from about 0.5 µm to about 1.0 µm. Although the second buffer layer 16 is described above as being of p-type conductivity silicon carbide, it will be understood that the present invention is not limited to this configuration. Alternatively, for example, the second buffer layer 16 may be of n-type conductivity, for example, very lightly doped n-type conductivity SiC or undoped SiC as discussed above with respect to first buffer layer 12. In some embodiments of the present invention, the second buffer layer 16 may be provided directly on the substrate 10.

An n-type conductivity channel layer 18 is provided on the second buffer layer 16. The n-type conductivity channel layer 18 may be formed of n-type conductivity silicon carbide of 6H, 4H, 15R or 3C polytype and may have a thickness of about 0.25 µm. The n-type conductivity channel layer may include one or more layers of, for example, n-type conductivity silicon carbide having different carrier concentrations. For example, the n-type conductivity channel layer 18 may include a first n-type conductivity channel layer 15 and a second n-type conductivity channel layer 19 as illustrated, for example, in FIG. 4, which will be discussed further below. Alternatively, the n-type conductivity channel layer 18 may include first, second and third layers of n-type conductivity SiC as discussed in detail in commonly assigned United States Patent Application Publication No. U.S. 2003/0075719 to Sriram, filed on Oct. 24, 2001 entitled Delta Doped Silicon Carbide Metal-Semiconductor Field Effect Transistors Having a Gate Disposed in a Double Recess Structure, the disclosure of which is incorporated herein by reference as if set forth in its entirety.

As further illustrated in FIG. 1, $n^+$ regions 13 and 17 that respectively define a source region and a drain region of the device are provided. The source and drain regions 13 and 17 are typically of n-type conductivity silicon carbide and have carrier concentrations that are greater than the carrier concentration of the n-type conductivity channel layer 18. For the $n^+$ regions 13 and 17, carrier concentrations of about $1\times10^{19}$ cm$^{-3}$ may be suitable, but carrier concentrations as high as possible are preferred.

Ohmic contacts 26 and 22 are provided on the source and drain regions 13 and 17, respectively, and are spaced apart so as to provide the source contact 26 and the drain contact 22. An ohmic contact 27 is also provided on a first surface 10A of the substrate 10 to provide a substrate contact 27. As illustrated in FIG. 1, the drain contact 22 may be coupled to the substrate contact 27 on the first surface 10A of the substrate 10. An ohmic contact 25 is also provided on the $p^+$ conductivity region 14 to provide a $p^+$ contact 25. The $p^+$ conductivity region 14 is maintained at the same potential as the source by, for example, electrically coupling the $p^+$ ohmic contact 25 to the source contact 26. Finally, a backside substrate contact 34 is also provided on a second surface 10B of the substrate 10, opposite the first surface 10A of the substrate 10. In some embodiments of the present invention, the backside substrate contact 34 may be an ohmic contact and in further embodiments of the present invention the backside substrate contact 34 may be a non-ohmic contact without departing from the teachings of the present invention.

In some embodiments of the present invention, the ohmic contacts 22, 25, 26, 27 and 34 may include nickel or other suitable metals. In some embodiments of the present invention, the ohmic contacts 22, 26, 27 and 34 may be similar to contacts discussed in commonly assigned U.S. patent application Ser. No. 10/884,930 filed Jul. 6, 2004, entitled Silicon-Rich Nickel Silicide Ohmic Contacts for SiC Semiconductor Devices, the disclosure of which is incorporated herein by reference as if set forth in its entirety. An insulator layer 20, such as an oxide, may be further provided on the exposed surface of the device.

MESFETs according to some embodiments of the present invention include first and second contact via holes 52 and 42 and a first recess 43. The first recess 43 is provided between the source and drain regions 13 and 17. The first recess 43 extends into the n-type conductivity channel layer 18 and exposes the n-type conductivity channel layer 18. The first contact via hole 52 is provided on the drain region 17 and extends at least to a first surface 10A of the substrate 10 exposing at least a portion of the first surface 10A of the substrate 10. The second contact via hole 42 is provided adjacent the source region 13 and exposes at least a portion of the $p^+$ region 14.

As further illustrated in FIG. 1, the first contact via hole 52 extends through the drain region 17, the n-type channel region 18, the second buffer layer 16 and the first buffer layer 12 to the first surface 10A of the substrate 10. In some embodiments of the present invention, the first contact via hole 52 may be provided the drain region 17 of the MESFET as illustrated in the plan view of FIG. 6. In further embodiments of the present invention, the MESFET may further include a drain pad 55 electrically coupled to the drain region 17 as illustrated in FIG. 7. In these embodiments of the present invention, the first contact via hole 52 may be provided in the drain pad 55 coupled to the substrate 10 as illustrated in FIG. 7, which will be discussed further below.

As illustrated in embodiments of FIG. 1, the gate contact 24 may be provided in the first recess 43 between the source region 13 and the drain region 17. The gate contact 24 may be formed of chromium, platinum, platinum silicide, nickel, and/or TiWN, however, other metals such as gold, known to one skilled in the art to achieve the Schottky effect, may be used. The Schottky gate contact 24 typically has a three layer structure. Such a structure may have advantages because of the high adhesion of chromium (Cr). For example, the gate contact 24 can optionally include a first gate layer of chromium (Cr) contacting the n-type conductivity channel layer 18. The gate contact 24 may further include an overlayer 32 of platinum (Pt) and gold or other highly conductive metal. Alternatively, the gate contact 24 may include a first layer of nickel in the first recess 43 on the n-type conductivity channel layer 18. The gate contact 24 may further include an overlayer 32 on the first layer of nickel that includes a layer of gold.

As further illustrated in FIG. 1, metal overlayers 28, 30 and 32 may be provided on the source and $p^+$ contacts 26 and 25, the drain and substrate contacts 22 and 27 and the gate contact 24, respectively. The overlayers 28, 30 and 32 may be gold, silver, aluminum, platinum and/or copper. Other suitable highly conductive metals may also be used for the overlayers. Furthermore, the metal overlayer 30 may electrically couple the substrate contact 27 of the substrate 10 to the drain contact 22 and the metal overlayer 28 may electrically couple the $p^+$ contact 25 of the $p^+$ region 14 to the source contact 26.

In selecting the dimensions of the MESFET, the width of the gate is defined as the dimension of the gate perpendicular to the flow of current. As shown in the cross-section of FIG. 1, the gate width runs into and out of the page. The length of the gate is the dimension of the gate parallel to the flow of current. As seen in the cross-sectional views of FIG. 1, the gate length is the dimension of the gate contact 24 that is in contact with the n-type conductivity channel layer 18. For example, the gate length of the MESFET according to certain embodiments of the present invention may be from about 0.4 μm to about 0.7 μm. Another dimension is the source to gate distance, which is shown in the cross-section of FIG. 1, as the distance from the source contact 26 or $n^+$ region 13, to the gate contact 24. The source to gate distance according to certain embodiments of the present invention may be from about 0.5 μm to about 0.7 μm. Furthermore, the distance from the drain contact 22 to the gate contact 24 may be from about 1.5 μm to about 2 μm. Embodiments of the present invention may further include a plurality of unit cells of MESFETs, and the distance from a first gate of the unit cells to a second gate may be, for example, from about 20 μm to about 50 μm.

Although not illustrated in FIG. 1, in embodiments of the present invention having an n-type substrate 10 and the first contact via hole 52 that extends at least to a first surface 10A of the substrate 10, a wire may be provided from a drain pad 55 (FIG. 7) to the backside substrate contact 34. In embodiments of the present invention including the wire, the backside substrate contact 34 is typically a non-ohmic contact.

Figure 2:
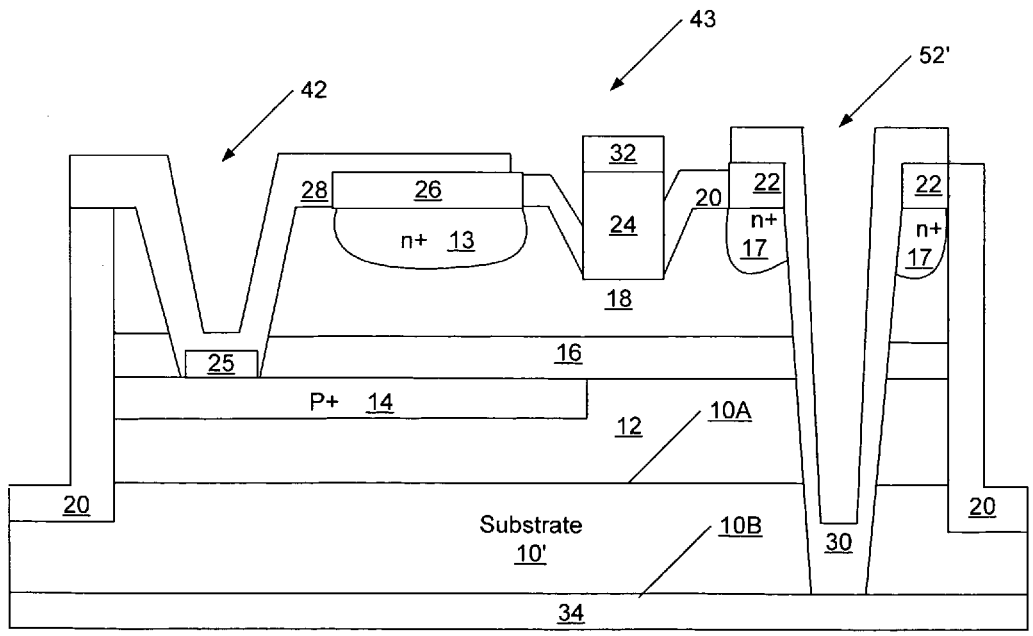
FIG. 2 is a cross-sectional view of MESFETs according to further embodiments of the present invention.

Referring now to FIG. 2, MESFETs according to further embodiments of the present invention will be discussed. Embodiments of the present invention illustrated in FIG. 2 are similar to embodiments of the present invention illustrated in FIG. 1, thus, the like numbered elements will not be discussed in detail with respect to FIG. 2. As illustrated in FIG. 2, the first contact via hole 52' extends through the drain region 17, the n-type channel region 18, the second buffer layer 16, the first buffer layer 12 and through the first surface 10A of the substrate 10' to a second surface 10B of the substrate 10'. In the embodiments of the present invention illustrated in FIG. 2, the substrate 10' may be an n-type conductivity substrate or a semi-insulating substrate. In embodiments of the present invention having n-type conductivity substrates, the substrate 10' may be a thick substrate or a thin substrate. In embodiments of the present invention having a semi-insulating substrate, the substrate 10' is preferably a thin substrate. It will be understood that the first contact via hole 52' may be provided in the drain region of the MESFET as illustrated in the plan view of FIG. 6 or in a drain pad coupled to the substrate 10 as illustrated in FIG. 7, which will be discussed further below.

Figure 3A:
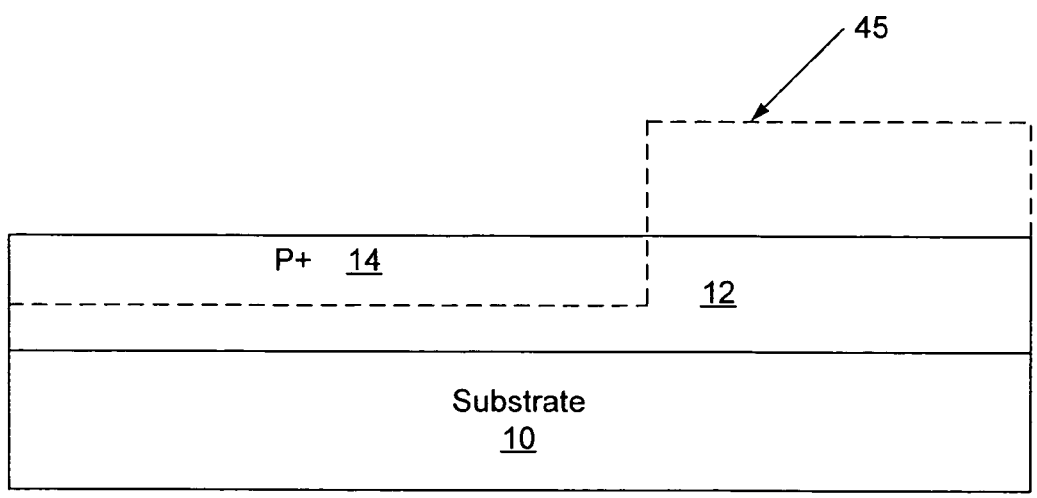
FIGS. 3A through 3J illustrate processing steps in the fabrication of MESFETs according to some embodiments of the present invention.

FIGS. 3A through 3J illustrate the fabrication of MESFETs according to some embodiments of the present invention. As seen in FIG. 3A, a buffer layer 12 may be grown or deposited on a substrate 10. As discussed above, in embodiments of the present invention illustrated in FIG. 1, the substrate 10 may be an n-type substrate and in embodiments of the present invention illustrated in FIG. 2, the substrate 10' may be semi-insulating or n-type conductivity substrate. The buffer layer 12 may be of p-type conductivity silicon carbide having a carrier concentration of about $3.0 \times 10^{15}$ $cm^{-3}$ or less, but typically $1.0 \times 10^{15}$ $cm^{-3}$ or less. Alternatively, the buffer layer 12 may be n-type silicon carbide or undoped silicon carbide.

In embodiments of the present invention including semi-insulating substrates, the substrates 10' may be fabricated as described in commonly assigned U.S. Pat. No. 6,218,680 to Carter et al. entitled Semi-insulating Silicon Carbide Without Vanadium Domination, the disclosure of which is hereby incorporated by reference herein as if set forth in its entirety. Such a semi-insulating substrate may be produced by providing silicon carbide substrates with sufficiently high levels of point defects and sufficiently matched levels of p-type and n-type dopants such that the resistivity of the silicon carbide substrate is dominated by the point defects. Such a domination may be accomplished by fabricating the silicon carbide substrate at elevated temperatures with source powders that have concentrations of heavy metals, transition elements or other deep level trapping elements of less than about $1 \times 10^{16}$ $cm^{-3}$ and preferably less than about $1.0 \times 10^{14}$ $cm^{-3}$. For example, temperatures between about 2360° C. and 2380° C. with the seed being about 300° C. to about 500° C. lower may be utilized. Other techniques for providing semi-insulating substrates may also be used.

Figure 3B:
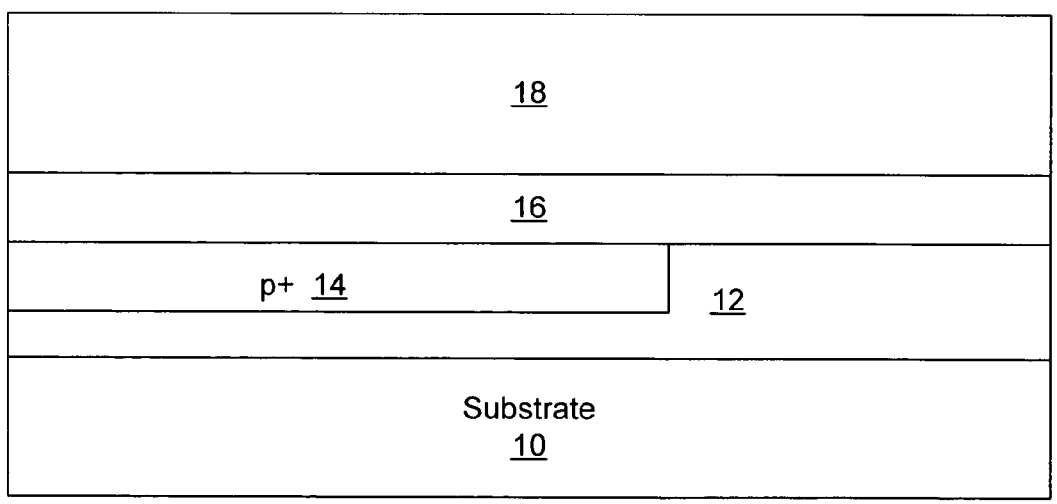

As further illustrated in FIG. 3A, a mask 45 may be formed for implanting the $p^+$ region 14. The $p^+$ region 14 is typically formed by ion implantation of, for example, aluminum, boron and/or gallium, followed by a high temperature anneal. Suitable anneal temperatures may be from about 1300 to about 1600° C., typically about 1500° C. The ion implantation may be performed on the regions that are not covered by the mask 45 to form $p^+$ region 14 as illustrated in FIG. 3B. Thus, the ions are implanted in portions of the buffer layer 12 or the substrate 10, to provide a highly doped region of p-type conductivity, for example, p-type conductivity silicon carbide. Once implanted, the dopants are annealed to activate the implant. The highly doped region of p-type conductivity may extend about 0.4 µm into the buffer layer 12 or the substrate 10'.

As seen in FIG. 3B, a second buffer layer 16 and an n-type conductivity channel layer 18 are grown or deposited on the buffer layer 12. It will be understood that if the buffer layer 12 is not included, the second buffer layer 16 and the n-type conductivity channel layer 18 may be grown or deposited on the substrate 10'. The second buffer layer 16 is formed on the buffer layer 12 and the n-type conductivity channel layer 18 is formed on the second buffer layer 16 as illustrated in FIG. 3B.

Figure 3C:
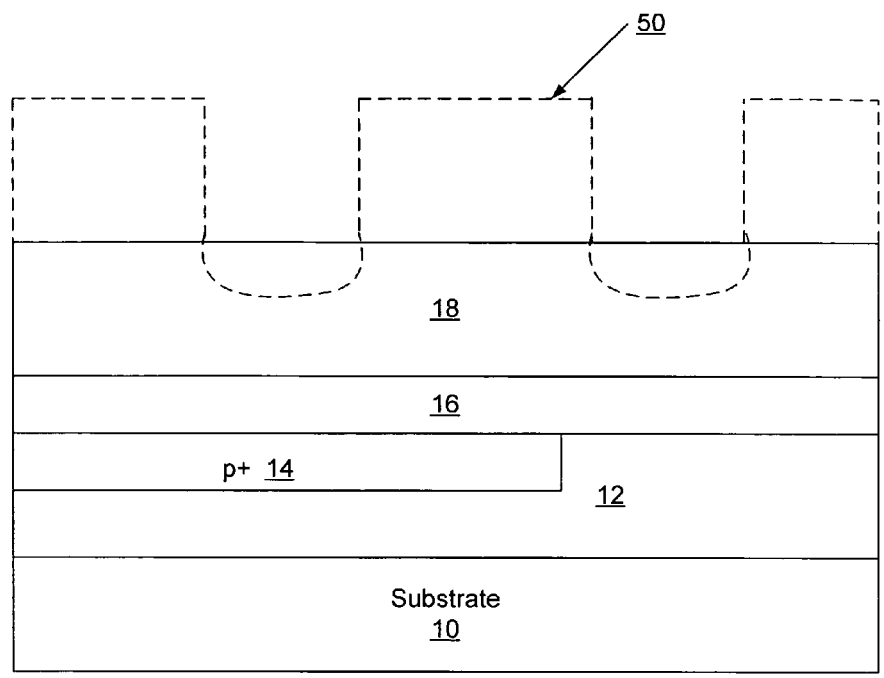
Figure 3D:
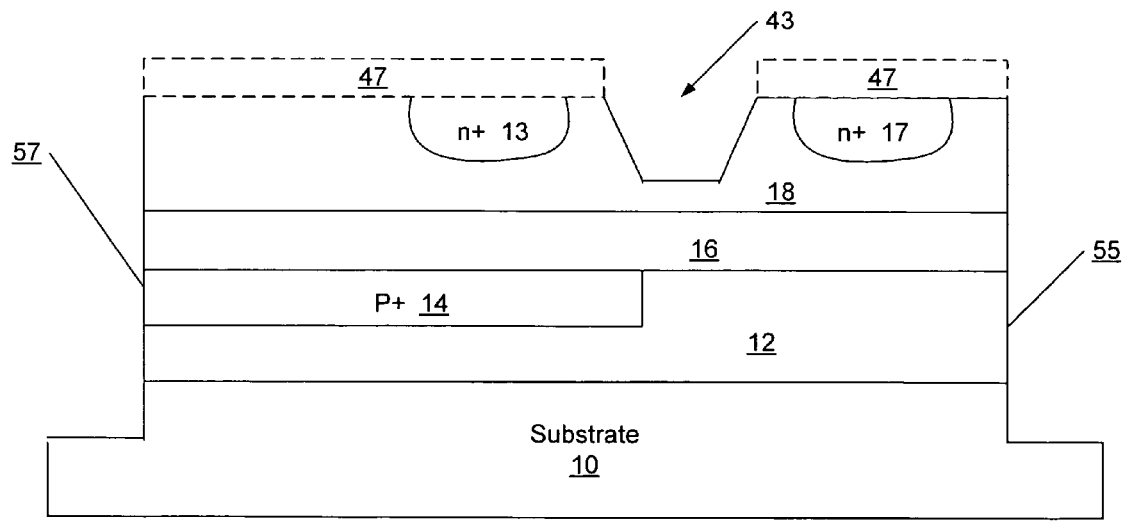

As illustrated in FIG. 3C, a mask 50 may be formed for implanting $n^+$ regions 13 and 17. Regions 13 and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 50 to form $n^+$ regions 13 and 17 that respectively define source and drain regions as illustrated in FIG. 3D. Thus, the ions are implanted in portions of the n-type conductivity channel layer 18 to provide highly doped regions of n-type conductivity, for example, n-type conductivity SiC, having higher carrier concentrations than the n-type conductivity channel layer 18. Once implanted, the dopants are annealed to activate the implant.

As seen in FIG. 3D, the substrate 10, the buffer layer 12, the $p^+$ region 14, the second buffer layer 16 and the n-type conductivity channel layer 18 may be etched to form an isolation mesa. The mesa has sidewalls 55, 57 defined by the substrate 10, the buffer layer 12, the $p^+$ region 14, the second buffer layer 16 and the n-type conductivity channel layer 18 that define the periphery of the transistor. The sidewalls of the mesa extend downward past the $p^+$ conductivity region 14. The mesa may be formed to extend into the substrate 10 of the device as shown in FIG. 3D. The mesa may extend past the depletion region of the device to confine current flow in the device to the mesa and reduce the capacitance of the device. The mesa is preferably formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

Figure 4:
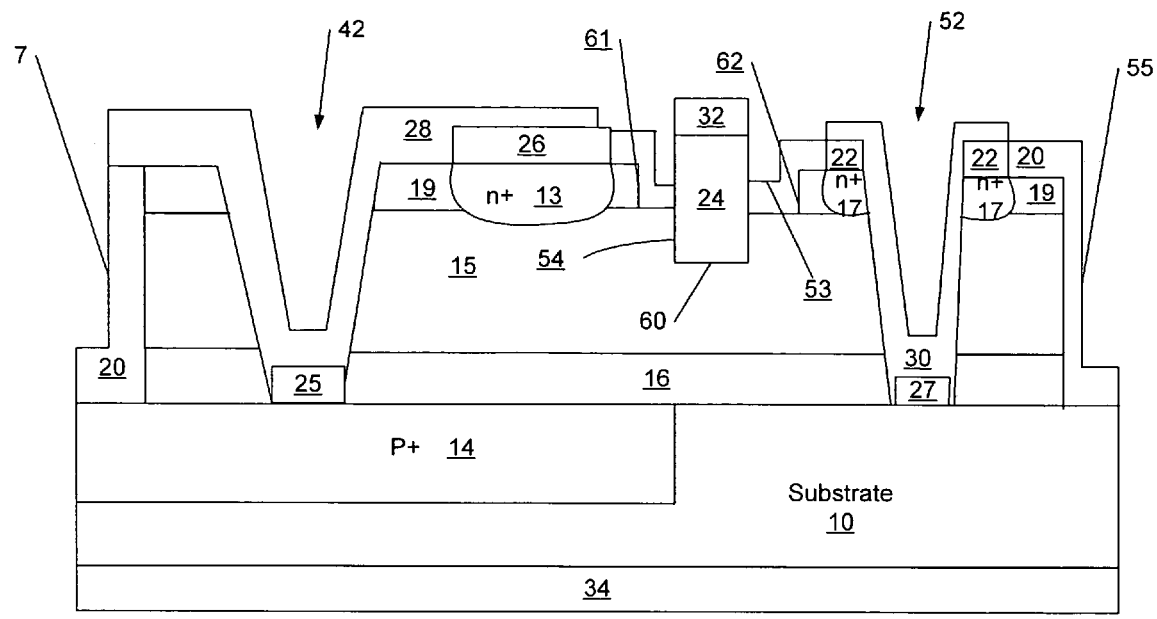
FIG. 4 is a cross-sectional view of MESFETs according to further embodiments of the present invention.

In certain embodiments, only the second buffer layer 16 and the n-type conductivity channel layer 18 may be etched to form an isolation mesa as shown in FIG. 4. In these embodiments, the sidewalls 55, 57 are defined by the second buffer layer 16 and the n-type conductivity channel layer 18, which define the periphery of the transistor.

FIG. 3D further illustrates the formation of a first recess 43 of the MESFET. The first recess 43 may be formed by forming a mask 47 and then etching through the n-type conductivity channel layer 18 to form the first recess 43 according to the mask 47. The first recess 43 may be formed by an etching process, such as a dry or wet etch process. For example, the first recess 43 may be formed by dry etching, for example, Electron Cyclotron Resonance (ECR) or Inductively Coupled Plasma (ICP) etching. The mask 47 may be removed.

Figure 3E:
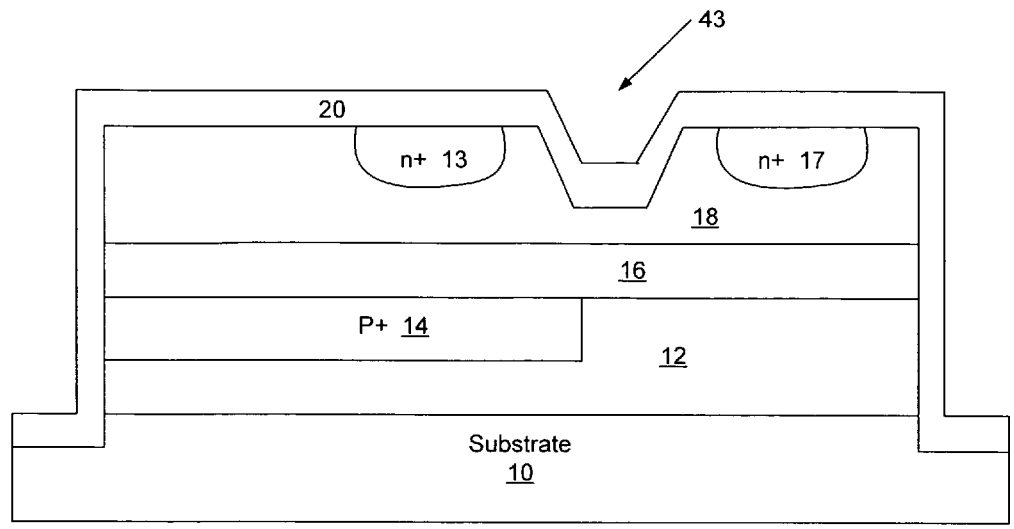

FIG. 3E illustrates the formation of an insulator layer 20, for example, an oxide layer, after the first recess 43 has been formed as discussed above. The insulator layer 20 may be grown or deposited over the exposed surface of the existing structure, i.e. on the isolation mesa, source and drain regions 13 and 17, the n-type conductivity channel layer 18 and in the first recess 43. The oxidation process may remove, for example, SiC that may have been damaged by the etch process and may also smooth out roughness that may have been created on the surface by the etch.

Figure 3F:
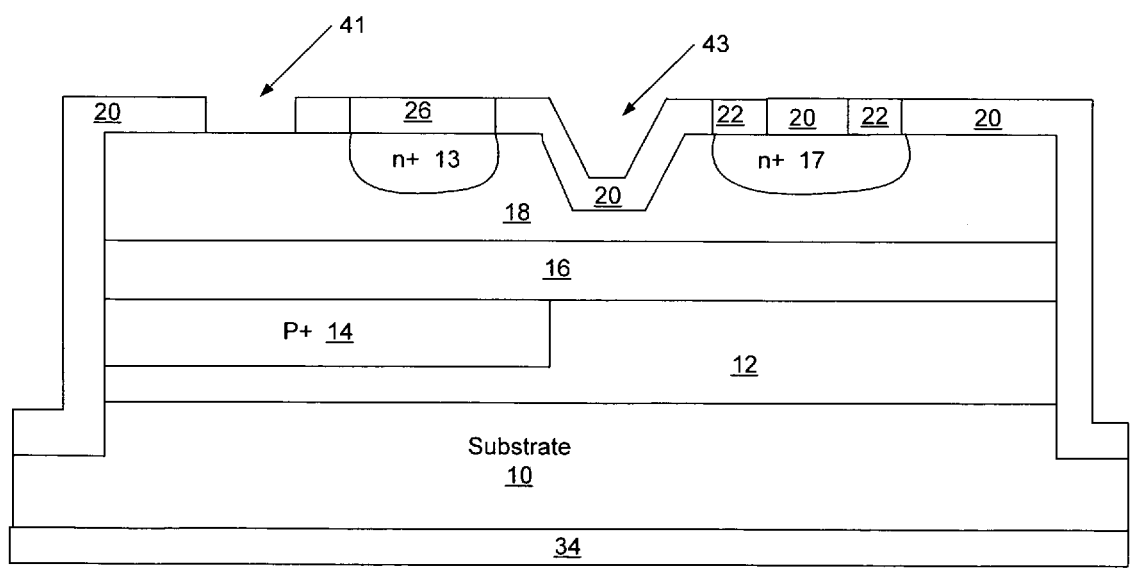

Referring now to FIG. 3F, contact windows may be etched through the insulator layer 20 to the source and drain regions 13 and 17, respectively. Nickel may be evaporated to deposit the source and drain contacts 26 and 22, respectively as illustrated in FIG. 3F. The nickel may be annealed to form the ohmic contacts 26 and 22 as illustrated in FIG. 3F. Such a deposition and annealing process may be carried out utilizing conventional techniques known to those of skill in the art. For example, the ohmic contacts 26 and 22 may be annealed at a temperature of from about 950° C. to about 1100° C. for about 2 minutes. However, other times and temperatures may also be utilized. Times from about 30 seconds to about 10 minutes may be, for example, acceptable. As further illustrated in FIG. 3F, after forming the ohmic contacts 26 and 22, a third contact window 41 may be etched in the insulator layer 20 above the highly doped $p^+$ region 14.

As further illustrated in FIG. 3F, some embodiments of the present invention include a backside substrate contact 34. In some embodiments of the present invention, for example, embodiments of the present invention where the substrate 10 is a thin substrate, the backside substrate contact 34 may be formed close to the end of the fabrication process. In further embodiments of the present invention, for example, in embodiments of the present invention having thicker substrates 10, the backside substrate contact 34 may be formed at approximately the same time as ohmic contacts 26 and 22.

Figure 3G:
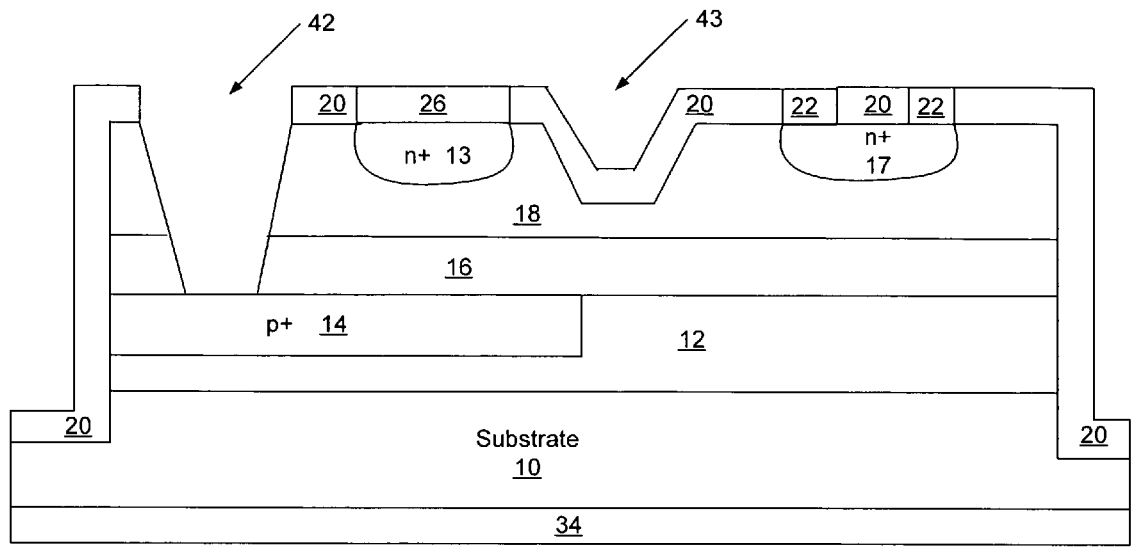

As illustrated in FIG. 3G, a first contact via hole 42 of the MESFET may be formed. The contact via hole 42 may be etched in the portion of the MESFET defined by window 41 in the insulator layer 20. The n-type conductivity channel layer 18 and the second buffer layer 16 may be etched through to expose the $p^+$ conductivity region 14 to form the contact via hole 42. The etching process may be, for example, a dry or wet etch process.

Figure 3H:
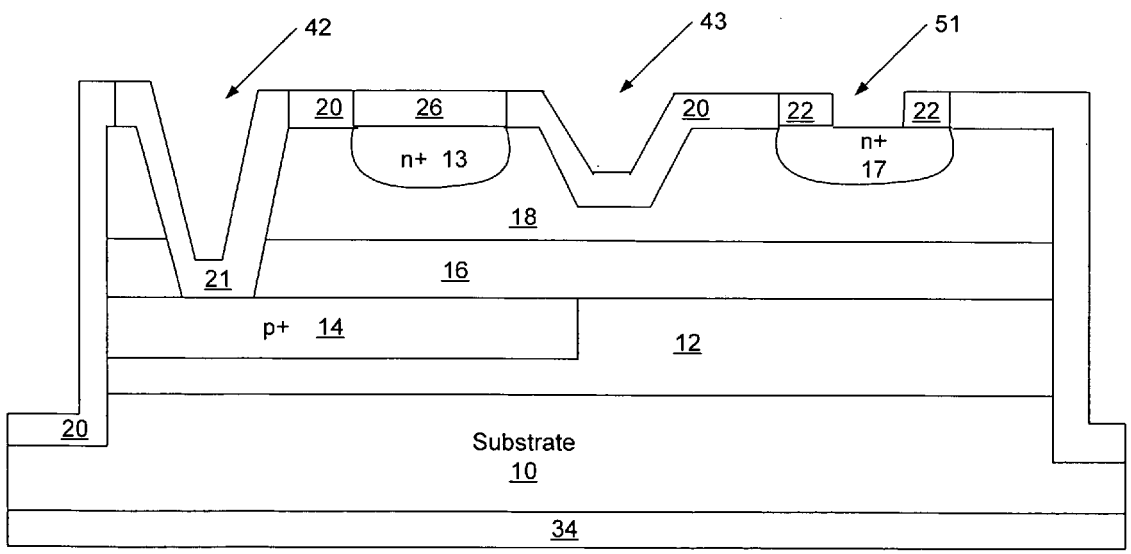

As illustrated in FIG. 3H, after formation of the contact via hole 42, an insulator 21 may be formed in the contact via hole 42. As further illustrated in FIG. 3H, a second contact window 51 may be etched in the insulator layer 20 above the drain region 17 at least partially exposing the drain region 17.

Figure 3I:
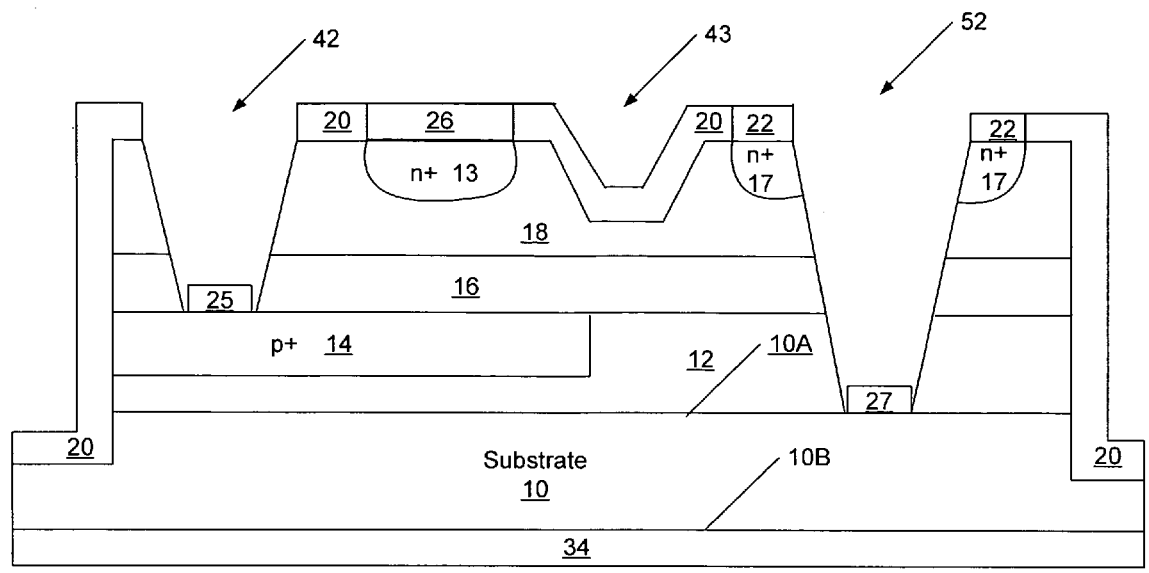

As illustrated in FIG. 3I, a second contact via hole 52 of the MESFET may be formed. The second contact via hole 52 may be etched in the portion of the MESFET defined by window 51 in the insulator layer 20. The n-type conductivity channel layer 18, the second buffer layer 16, and the first buffer layer 12 may be etched through to expose a first surface 10A of the substrate 10 to form the second contact via hole 52. The etching process may be, for example, a dry or wet etch process. As discussed above, in some embodiments of the present invention, the second contact via hole 52 may extend through the substrate 10 to a second surface 10B of the substrate such that a portion of the backside substrate contact 34 is exposed when the device is complete.

As further illustrated in FIG. 3I, nickel may be evaporated to deposit the $p^+$ contact 25 and the substrate contact 27. The nickel may be annealed to form the $p^+$ and substrate contacts 25 and 27. Such a deposition and annealing process may be carried out utilizing conventional techniques known to those of skill in the art. For example, the ohmic contacts 25 and 27 may be annealed at a temperature of from about 600° C. to about 1050° C. Other suitable metals may also be used without departing from the teachings of the present invention.

Figure 3J:
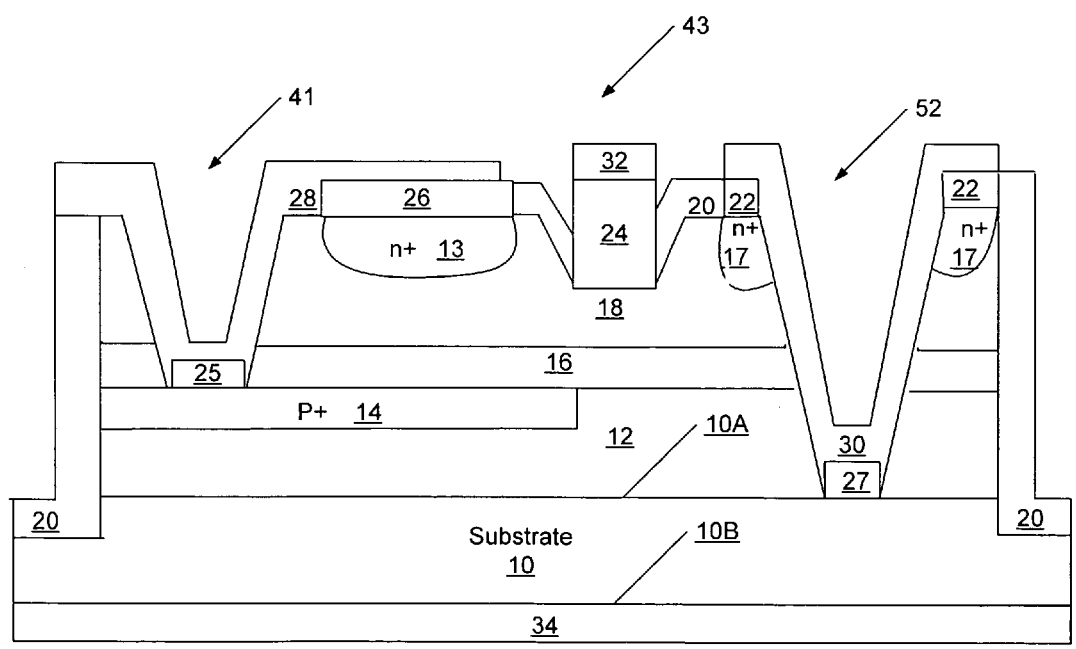

FIG. 3J illustrates the formation of the gate contact 24 and the overlayers 28, 30 and 32. For example, a window may be opened in the insulator 20 and a layer of chromium may be deposited in the first recess 43. Typically, the chromium layer is formed by evaporative deposition. The gate structure may then be completed by deposition of platinum and gold. As will also be appreciated by those of skill in the art, the overlayers 28 and 30 may be formed either before or after formation of the gate structure. In fact, if the titanium/platinum/gold structure is utilized, the platinum and gold portions of the overlayer may be formed in the same processing steps as the platinum and gold portions 32 of the gate structure. Accordingly, the overlayers 28 and 30 may be formed prior to the formation of a gate contact or after the formation of a gate contact. As further illustrated, the drain contact 22 and the substrate contact 27 share a single overlayer 30, which electrically couples the drain region to the substrate 10. Similarly, the source contact 26 and the $p^+$ contact 25 also share a single overlayer 28, which electrically couples the source region to the highly doped p-type conductivity region 14.

In some embodiments of the present invention, for example, embodiments of the present invention illustrated in FIG. 2, the substrate contact 27 may be omitted and the overlayer 30 may be electrically coupled to the backside substrate contact 34. As illustrated in FIG. 2, in these embodiments the contact via hole 52 extends through the substrate 10 to expose the backside substrate contact 34.

Referring now to FIG. 4, a cross-sectional view of a transistor according to further embodiments of the present invention will be discussed. Like numbers refer to like elements in previously described figures, thus, detailed descriptions of these elements will be omitted. As illustrated in FIG. 4, in some embodiments of the present invention the gate contact 24 is provided in a double recessed structure containing first and second recesses. In particular, a first recess 53 has a floor 60 that extends through the first n-type conductivity channel layer 19 to the second n-type channel layer 15. A second recess 54 is provided between the sidewalls 61, 62 of the first recess. A first sidewall 61 of the first recess 53 is between the source contact 26 and the gate contact 24 and a second sidewall 62 of the first recess 53 is between the drain contact 22 and the gate contact 24. The floor of the second recess 54 extends into the second n-type conductivity channel layer 15, for example, a distance of about 600 Å. The double recessed structure is discussed further in commonly assigned United States Patent Application Publication No. U.S. 2003/0075719 to Sriram, filed on Oct. 24, 2001 entitled Delta Doped Silicon Carbide Metal-Semiconductor Field Effect Transistors Having a Gate Disposed in a Double Recess Structure.

Figure 5:
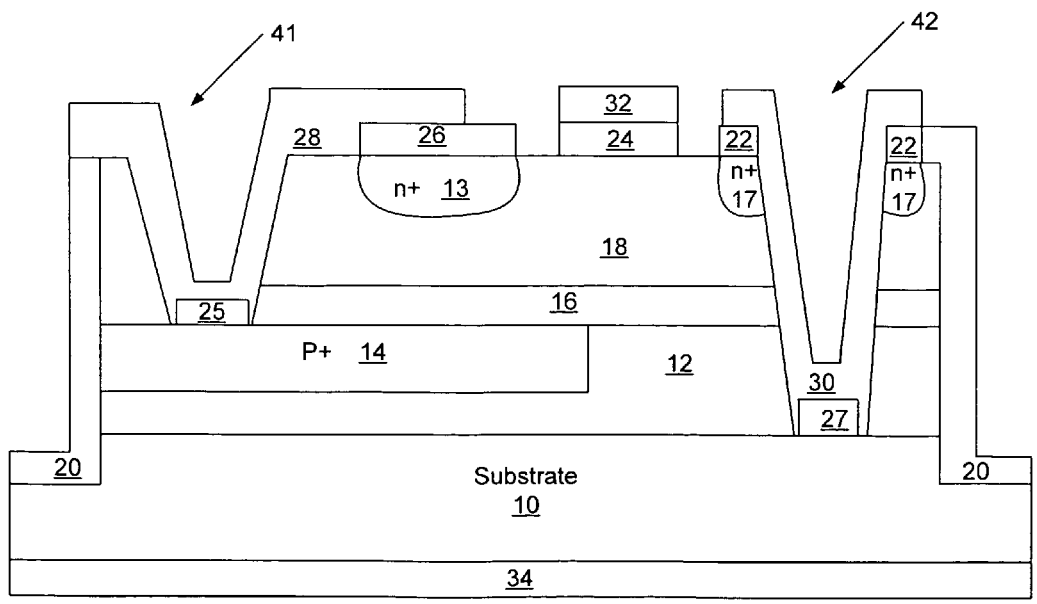
FIG. 5 is a cross-sectional view of MESFETs according to still further embodiments of the present invention.

Now referring to FIG. 5, a cross-sectional view of a MESFET according to further embodiments of the present invention will be discussed. Like numbers refer to like elements in previously described figures, thus, descriptions of these elements will be omitted. As illustrated in FIG. 5, the gate contact 24 is disposed on the n-type conductivity channel layer 18 and is not disposed in a single or double recess.

Figure 6:
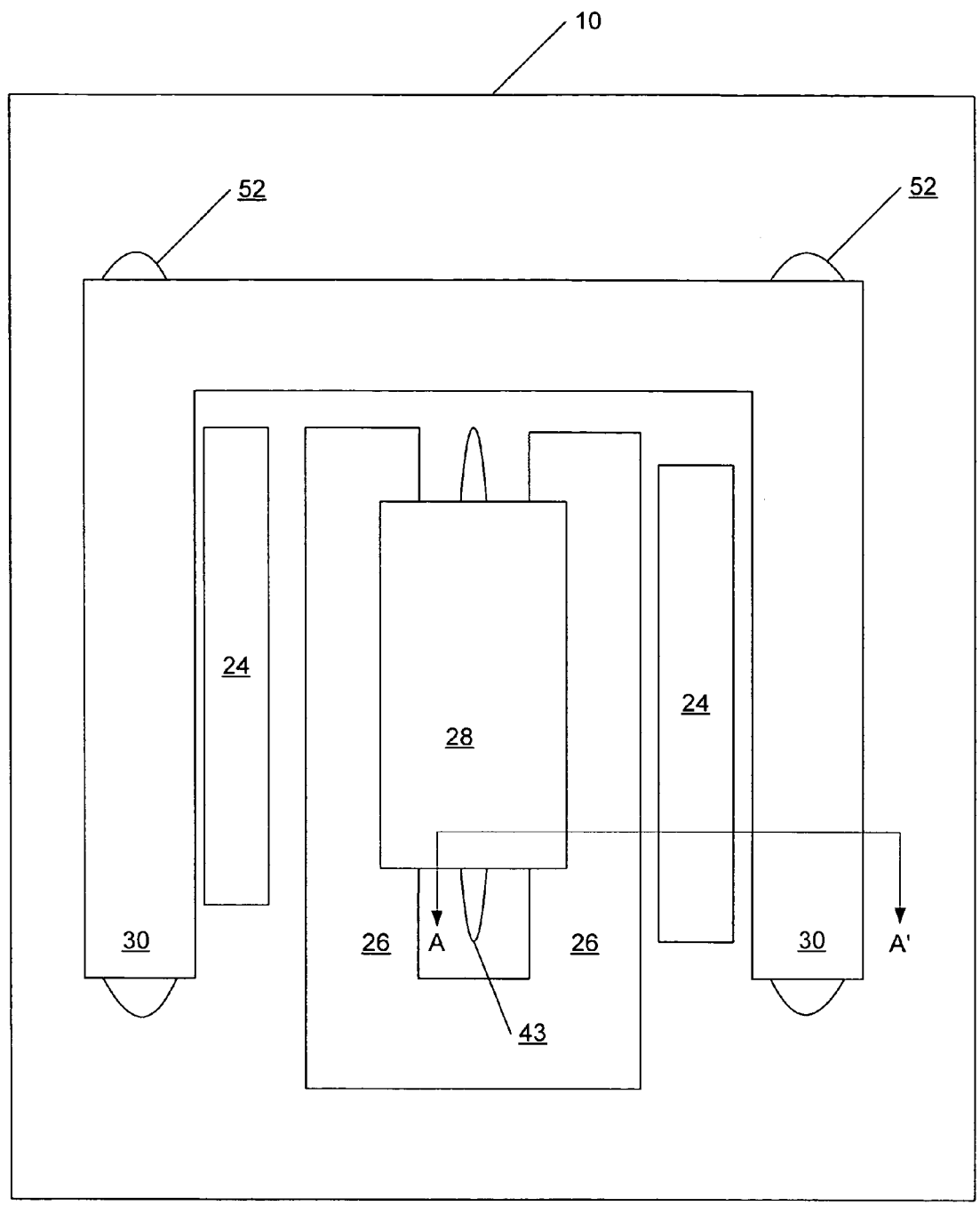
FIG. 6 is a plan view of MESFETs according to some embodiments of the present invention.
Figure 7:
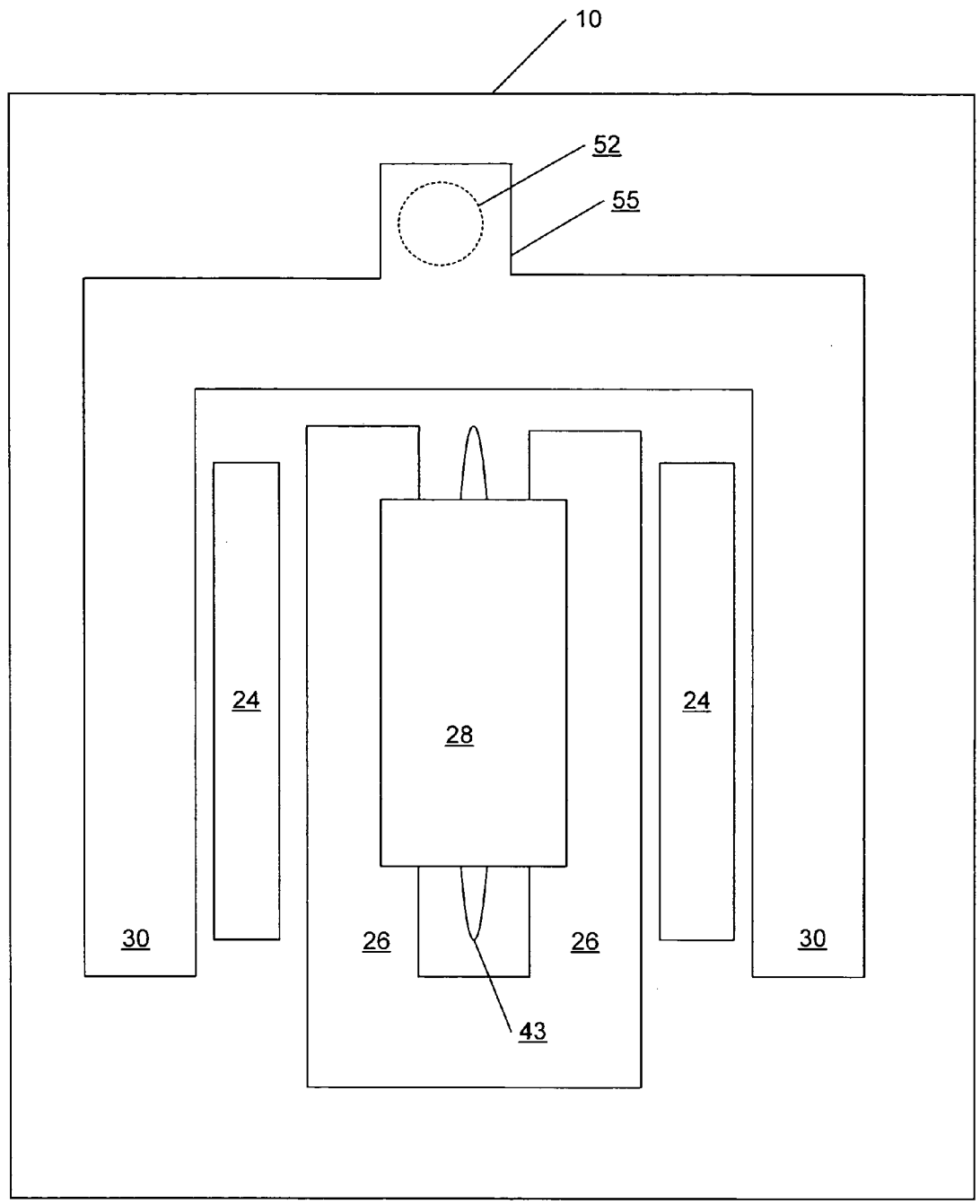
FIG. 7 is a plan view of MESFETs according to some embodiments of the present invention.

Referring now to FIG. 6, a plan view (top view) of MESFETs according to certain embodiments of the present invention will be described. As illustrated in FIG. 6, a plurality of unit cells are provided on a substrate 10. A gate contact 24 is situated between a source contact 26 and a drain contact 22 (not shown). As illustrated in FIG. 6, the source contacts 26 and drain contacts 22 are interdigitated. An overlayer 28 electrically couples the source contact 26 to a p⁺ region 14 (not shown) via a p⁺ contact 25 (not shown) that is disposed in the contact via hole 42. A second overlayer 30 electrically couples the drain contact 22 to the substrate 10 via a substrate contact 27 (not shown) that is disposed in the second contact via hole 52.

Referring now to FIG. 7, a plan view of MESFETs according to certain embodiments of the present invention will be described. As illustrated in FIG. 7, a plurality of unit cells are provided on a substrate 10. A gate contact 24 is situated between a source contact 26 and a drain contact 22 (not shown). As illustrated in FIG. 6, the source contacts 26 and drain contact 22 (not shown) are interdigitated. An overlayer 28 electrically couples the source contact 26 to a p⁺ region (not shown) via a p⁺ contact (not shown) that is disposed in the first contact via hole 42. As further illustrated in FIG. 6, a second contact via hole 52 may be provided in a drain pad 55. The overlayer 30 electrically couples the drain contact 22 (not shown) to the substrate 10 via a substrate contact 27 (not shown) that is disposed in the second contact hole via hole 52.

Although the present invention is described above with reference to SiC MESFETs, the present invention is not limited to SiC MESFETs. For example, MESFETs according to embodiments of the present invention may be, for example, gallium arsenide (GaAs) MESFETs or Gallium Nitride (GaN) MESFETs. In particular, if the present invention were described with respect to GaAs MESFETs, the p-type conductivity regions might be p-type conductivity GaAs regions, the n-type conductivity channel layers might be n-type conductivity GaAs layers and the like. Furthermore, MESFETs according to some embodiments of the present invention may be, for example, SiC MESFET MMICs, GaN HEMTs, GaN HEMT MMICs, GaAs MESFETs, GaAs MESFET MMICs, GaAs HEMTs, GaAs HEMT MMICs, GaAs pHEMTs, GaAs pHEMT MMICs and the like.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a metal-semiconductor field-effect transistor (MESFET), comprising a MESFET on a substrate, the MESFET having a source region, a drain region and a gate contact, the gate contact being between the source region and the drain region, the source region to gate contact distance being from about 0.5 to about 0.7 µm and the drain region to gate contact distance being from about 1.5 to about 2.0 µm and the drain region being electrically coupled to the substrate through a contact via hole to the substrate.

2. The unit cell of claim 1, wherein the substrate comprises an n-type substrate and wherein the contact via hole extends through the drain region and exposes a first surface of the substrate.

3. The unit cell of claim 2, wherein the substrate comprises an n-type silicon carbide (SiC) substrate.

4. The unit cell of claim 2, further comprising first and second ohmic contacts on the source and drain regions that respectively define a source contact and a drain contact, wherein the contact via hole extends through at least a portion of the drain contact.

5. The unit cell of claim 4, further comprising:
a substrate contact on the exposed first surface of the substrate; and
a first overlayer in the contact via hole and extending to the drain contact and the substrate contact, the first overlayer electrically coupling the drain contact to the substrate contact to electrically couple the drain region to the substrate.

6. The unit cell of claim 5, wherein the substrate contact is a non-ohmic contact.

7. The unit cell of claim 5, further comprising a third ohmic contact on a second surface of the substrate, opposite the first surface of the substrate, that defines a backside substrate contact.

8. The unit cell of claim 5, wherein the drain region is electrically coupled to a drain pad and wherein the contact via hole is at least partially located in the drain pad.

9. The unit cell of claim 5, wherein the substrate contact comprises an ohmic contact, the unit cell further comprising:
a non-ohmic backside substrate contact on a second surface of the substrate, opposite the first surface of the substrate;
a drain pad electrically coupled to the drain region; and
a wire electrically coupling the drain pad to the backside substrate contact.

10. The unit cell of claim 1, wherein the substrate comprises a semi-insulating substrate or an n-type substrate and wherein the contact via hole extends through a first surface of the substrate to a second surface of the substrate, opposite the first surface of the substrate.

11. The unit cell of claim 10, wherein the substrate comprises an n-type silicon carbide (SiC) substrate or a semi-insulating SiC substrate.

12. The unit cell of claim 10, further comprising:
first and second ohmic contacts on the source region and the drain region, respectively, that respectively define a source contact and a drain contact; and
a backside substrate contact on the second surface of the substrate, wherein the contact via hole exposes a portion of the backside substrate contact.

13. The unit cell of claim 12, further comprising:
a first overlayer in the contact via hole and extending to the drain contact and the backside substrate contact, the first overlayer electrically coupling the drain contact to the backside substrate contact to electrically couple the drain region to the substrate.

14. The unit cell of claim 12, wherein the drain region is electrically coupled to a drain pad and wherein the contact via hole is at least partially disposed in the drain pad.

15. The unit cell of claim 1, wherein the substrate has a thickness of from about 100 µm to about 400 µm.

16. The unit cell of claim 15, wherein the thickness of the substrate is about 300 µm.

17. The unit cell of claim 1, further comprising an n-type conductivity channel layer on the substrate, the gate contact being disposed on the n-type conductivity layer.

18. The unit cell of claim 17, wherein the n-type conductivity channel layer comprises n-type conductivity silicon carbide (SiC) and wherein the gate extends into the n-type conductivity SiC channel layer.

19. The unit cell of claim 18, wherein the gate contact is disposed in a single recess.

20. The unit cell of claim 17, further comprising implanted n-type conductivity regions in the n-type conductivity channel layer that respectively define the source region and the drain region, the implanted n-type conductivity regions having carrier concentrations greater than a carrier concentration of the n-type conductivity channel layer, wherein first and second ohmic contacts that respectively define a source contact and a drain contact are disposed on the source region and the drain region, respectively.

21. The unit cell of claim 17 further comprising:
a first buffer layer on the substrate; and
a second buffer layer on the first buffer layer, wherein the n-type conductivity channel layer is on the second buffer layer and wherein the contact via hole extends through the drain region, the n-type channel region and the first and second buffer layers to a first surface of the substrate.

22. The unit cell of claim 21 wherein the contact via hole further extends through the first surface of the substrate to a second surface of the substrate, opposite the first surface of the substrate.

23. The unit cell of claim 17 wherein the n-type conductivity channel layer comprises a first n-type conductivity channel layer on the substrate and a second n-type conductivity channel layer on the first n-type conductivity channel layer.

24. The unit cell of claim 1, wherein the substrate comprises n-type conductivity gallium arsenide (GaAs), semi-insulating GaAs, n-type conductivity gallium nitride (GaN) or semi-insulating GaN.

25. A unit cell of a metal-semiconductor field-effect transistor(MESFET), comprising:
a MESFET on a substrate, the MESFET having a source region, a drain region and a gate contact, the gate contact being between the source region and the drain region and the drain region being electrically coupled to the substrate through a contact via hole to the substrate; and
an n-type conductivity channel layer on the substrate, the gate contact being disposed on the n-type conductivity layer,
wherein the n-type conductivity channel layer comprises n-type conductivity silicon carbide (SiC), wherein the gate extends into the n-type conductivity SiC channel layer and wherein the gate contact is disposed in a double recess.

26. A unit cell of a metal-semiconductor field-effect transistor(MESFET), comprising:
a MESFET on a substrate, the MESFET having a source region, a drain region and a gate contact, the gate contact being between the source region and the drain region and the drain region being electrically coupled to the substrate through a contact via hole to the substrate; and
an n-type conductivity channel layer on the substrate, the gate contact being disposed on the n-type conductivity layer,
wherein the contact via hole comprises a first contact via hole, the unit cell further comprising:
a p-type conductivity region beneath the source region and having an end that extends towards the drain region, the p-type conductivity region being spaced apart from the n-type conductivity channel layer and being electrically coupled to the source region; and
a second contact via hole adjacent the source region that exposes the p-type conductivity region; and
an ohmic contact on the exposed portion of the p-type conductivity region.

27. A unit cell of a metal-semiconductor field-effect transistor(MESFET), comprising:
a MESFET on a substrate, the MESFET having a source region, a drain region and a gate contact, the gate contact being between the source region and the drain region and the drain region being electrically coupled to the substrate through a contact via hole to the substrate; and
an n-type conductivity channel layer on the substrate, the gate contact being disposed on the n-type conductivity layer,
wherein the n-type conductivity channel layer comprises first, second and third n-type conductivity SiC channel layers and wherein the first, second and third n-type conductivity channel layers have respective first, second and third carrier concentrations.

28. A unit cell of a metal-semiconductor field-effect transistor (MESFET), comprising:
a silicon carbide (SiC) MESFET having a source region, a drain region and a gate contact, the gate contact being between the source region and the drain region and the source region to gate contact distance being from about 0.5 to about 0.7 µm and the drain region to gate contact distance being from about 1.5 to about 2.0 µm; and
first and second ohmic contacts on the source region and the drain region, respectively, that respectively define a source contact and a drain contact, the drain region being electrically coupled to the substrate through a contact via hole to the substrate.

29. The unit cell of claim 28, wherein the substrate comprises an n-type substrate and wherein the contact via hole extends through the drain region and exposes a first surface of the substrate.

30. The unit cell of claim 29, further comprising first and second ohmic contacts on the source and drain regions that respectively define a source contact and a drain contact, wherein the contact via hole extends through at least a portion of the drain contact.

31. The unit cell of claim 30, further comprising:
a substrate contact on the exposed first surface of the substrate; and
a first overlayer in the contact via hole and extending to the drain contact and the substrate contact, the first overlayer electrically coupling the drain contact to the substrate contact to electrically couple the drain region to the substrate.

32. The unit cell of claim 31, wherein the substrate contact is a non-ohmic contact.

33. The unit cell of claim 31, further comprising a third ohmic contact on a second surface of the substrate, opposite the first surface of the substrate, that defines a backside substrate contact.

34. The unit cell of claim 31, wherein the drain region is electrically coupled to a drain pad and wherein the contact via hole is at least partially located in the drain pad.

35. The unit cell of claim 31, wherein the substrate contact comprises an ohmic contact, the unit cell further comprising:
a non-ohmic backside substrate contact on a second surface of the substrate, opposite the first surface of the substrate;
a drain pad electrically coupled to the drain region; and
a wire electrically coupling the drain pad to the backside substrate contact.

36. The unit cell of claim 28, wherein the substrate comprises a semi-insulating substrate or an n-type substrate and wherein the contact via hole extends through a first surface of the substrate to a second surface of the substrate, opposite the first surface of the substrate.

37. The unit cell of claim 36, further comprising:
first and second ohmic contacts on the source region and the drain region, respectively, that respectively define a source contact and a drain contact; and
a backside substrate contact on the second surface of the substrate, wherein the contact via hole exposes a portion of the backside substrate contact.

38. The unit cell of claim 37, further comprising:
a first overlayer in the contact via hole and extending to the drain contact and the backside substrate contact, the first overlayer electrically coupling the drain contact to the backside substrate contact to electrically couple the drain region to the substrate.

39. The unit cell of claim 37, wherein the drain region is electrically coupled to a drain pad and wherein the contact via hole is at least partially disposed in the drain pad.

40. A method of forming a unit cell of a metal-semiconductor field-effect transistor (MESFET), comprising forming a MESFET on a substrate, the MESFET having a source region, a drain region and a gate contact, the gate contact being between the source region and the drain region, the source region to gate contact distance being from about 0.5 to about 0.7 µm and the drain region to gate contact distance being from about 1.5 to about 2.0 µm and the drain region being electrically coupled to the substrate through a contact via hole to the substrate.

41. The method of claim 40, wherein the substrate comprises an n-type substrate and wherein the contact via hole extends through the drain region and exposes a first surface of the substrate.

42. The method of claim 41, wherein the substrate comprises an n-type silicon carbide (SiC) substrate.

43. The method of claim 41, further comprising forming first and second ohmic contacts on the source and drain regions that respectively define a source contact and a drain contact, wherein the contact via hole extends through at least a portion of the drain contact.

44. The method of claim 43, further comprising:
forming a substrate contact on the exposed first surface of the substrate; and
forming a first overlayer in the contact via hole and extending to the drain contact and the substrate contact, the first overlayer electrically coupling the drain contact to the substrate contact to electrically couple the drain region to the substrate.

45. The method of claim 44, wherein the substrate contact is a non-ohmic contact.

46. The method of claim 44 further comprising forming a third ohmic contact on a second surface of the substrate, opposite the first surface of the substrate, that defines a backside substrate contact.

47. The method of claim 44, further comprising electrically coupling the drain region to a drain pad, wherein the contact via hole is at least partially located in the drain pad.

48. The method of claim 44, wherein the substrate contact comprises an ohmic contact, the method further comprising:
forming a non-ohmic backside substrate contact on a second surface of the substrate, opposite the first surface of the substrate;
forming a drain pad electrically coupled to the drain region; and
forming a wire electrically coupling the drain pad to the backside substrate contact.

49. The method of claim 40, wherein the substrate comprises a semi-insulating substrate or an n-type substrate and wherein the contact via hole extends through a first surface of the substrate to a second surface of the substrate, opposite the first surface of the substrate.

50. The method of claim 49, wherein the substrate comprises an n-type silicon carbide (SiC) substrate or a semi-insulating SiC substrate.

51. The method of claim 49, further comprising:
forming first and second ohmic contacts on the source region and the drain region, respectively, that respectively define a source contact and a drain contact;
forming a backside substrate contact on the second surface of the substrate, wherein the contact via hole exposes a portion of the backside substrate contact.

52. The method of claim 51, further comprising:
a first overlayer in the contact via hole and extending to the drain contact and the backside substrate contact, the first overlayer electrically coupling the drain contact to the backside substrate contact to electrically couple the drain region to the substrate.

53. The method of claim 51, wherein the drain region is electrically coupled to a drain pad and wherein the contact via hole is at least partially disposed in the drain pad.

54. The method of claim 40, further comprising forming an n-type conductivity channel layer on the substrate, the gate contact being disposed on the n-type conductivity layer.

55. The method of claim 54, wherein forming the n-type conductivity channel layer comprises forming an n-type conductivity silicon carbide (SiC) channel layer, wherein the gate extends into the n-type conductivity SiC channel layer.

56. The method of claim 55, wherein the gate contact is disposed in a single recess.

57. The method of claim 54, further comprising:
implanting n-type dopants in the source region and the drain region so as to provide highly doped regions having higher carrier concentrations than the n-type conductivity channel layer, wherein first and second ohmic contacts that respectively define a source contact and a drain contact are disposed on the source region and the drain region, respectively.

58. The method of claim 57, wherein implanting n-type dopants further comprises annealing the n-type dopants to activate the n-type dopants.

59. The method of claim 54, further comprising:
forming a first buffer layer on the substrate; and
forming a second buffer layer on the first buffer layer, wherein the n-type conductivity channel layer is on the second buffer layer and wherein the contact via hole extends through the drain region, the n-type channel region and the first and second buffer layers to a first surface of the substrate.

60. The method of claim 59, wherein the contact via hole further extends through the first surface of the substrate to a second surface of the substrate, opposite the first surface of the substrate.

61. The method of claim 54, wherein forming the n-type conductivity channel layer comprises:
forming a first n-type conductivity channel layer on the substrate; and
forming a second n-type conductivity channel layer on the first n-type conductivity channel layer.

62. The method of claim 40, wherein the substrate comprises n-type conductivity or semi-insulating gallium arsenide (GaAs) and n-type conductivity or semi-insulating gallium Nitride (GaN).

63. A method of forming a unit cell of a metal-semiconductor field-effect transistor (MESFET), comprising:
forming a MESFET on a substrate, the MESFET having a source region, a drain region and a gate contact, the gate contact being between the source region and the drain region and the drain region being electrically coupled to the substrate through a contact via hole to the substrate; and forming an n-type conductivity channel layer on the substrate, the gate contact being disposed on the n-type conductivity layer, wherein forming the n-type conductivity channel layer comprises forming an n-type conductivity silicon carbide (SiC) channel layer, wherein the gate extends into the n-type conductivity SiC channel layer and wherein the gate contact is disposed in a double recess.

64. A method of forming a unit cell of a metal-semiconductor field-effect transistor (MESFET), comprising:

forming a MESFET on a substrate, the MESFET having a source region, a drain region and a gate contact, the gate contact being between the source region and the drain region and the drain region being electrically coupled to the substrate through a contact via hole to the substrate; and forming an n-type conductivity channel layer on the substrate, the gate contact being disposed on the n-type conductivity layer, wherein the contact via hole comprises a first contact via hole, the method further comprising:

forming a p-type conductivity region beneath the source region and having an end that extends towards the drain region, the p-type conductivity region being spaced apart from the n-type conductivity channel layer and being electrically coupled to the source region; and forming a second contact via hole adjacent the source region that exposes the p-type conductivity region; and forming an ohmic contact on the exposed portion of the p-type conductivity region.

65. A method of forming a unit cell of a metal-semiconductor field-effect transistor (MESFET), comprising:

forming a MESFET on a substrate, the MESFET having a source region, a drain region and a gate contact, the gate contact being between the source region and the drain region and the drain region being electrically coupled to the substrate through a contact via hole to the substrate;

forming an n-type conductivity channel layer on the substrate, the gate contact being disposed on the n-type conductivity layer;

forming a first buffer layer on the substrate; and forming a second buffer layer on the first buffer layer, wherein the n-type conductivity channel layer is on the second buffer layer and wherein the contact via hole extends through the drain region, the n-type channel region and the first and second buffer layers to a first surface of the substrate, wherein forming the n-type conductivity channel layer comprises:

forming first, second and third n-type conductivity SiC channel layers and wherein the first, second and third n-type conductivity channel layers have respective first, second and third carrier concentrations.

66. A method of forming a unit cell of a metal-semiconductor field-effect transistor (MESFET), comprising:

forming a MESFET on a substrate, the MESFET having a source region, a drain region and a gate contact, the gate contact being between the source region and the drain region and the drain region being electrically coupled to the substrate through a contact via hole to the substrate; and forming an n-type conductivity channel layer on the substrate, the gate contact being disposed on the n-type conductivity layer, wherein forming the contact via hole comprises:

etching a contact window for the contact via hole in an oxide layer on the drain region; and etching the n-type conductivity channel layer, and first and second buffer layers through the contact window to expose the substrate.

* * * * *